United States Patent
Chai

(10) Patent No.: US 12,254,932 B2
(45) Date of Patent: Mar. 18, 2025

(54) MEMORY DEVICE FOR EFFECTIVELY CHECKING PROGRAM STATE AND OPERATION METHOD THEREOF

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 91 days.

(21) Appl. No.: 18/073,751

(22) Filed: Dec. 2, 2022

(65) Prior Publication Data

US 2024/0038312 A1    Feb. 1, 2024

(30) Foreign Application Priority Data

Jul. 28, 2022   (KR) .......................... 10-2022-0093789

(51) Int. Cl.
| | |
|---|---|
| *G11C 11/08* | (2006.01) |
| *G11C 16/08* | (2006.01) |
| *G11C 16/10* | (2006.01) |
| *G11C 16/24* | (2006.01) |
| *G11C 16/34* | (2006.01) |

(52) U.S. Cl.
CPC .......... *G11C 16/3459* (2013.01); *G11C 16/08* (2013.01); *G11C 16/102* (2013.01); *G11C 16/24* (2013.01)

(58) Field of Classification Search
CPC ... G11C 16/3459; G11C 16/08; G11C 16/102; G11C 16/24; G11C 2211/5642; G11C 11/5628; G11C 16/32; G11C 16/0483; G11C 16/12; G11C 16/30; G11C 16/10; G11C 16/26

USPC ...................................................... 365/185.22
See application file for complete search history.

(56) References Cited

U.S. PATENT DOCUMENTS

| | | | |
|---|---|---|---|
| 2007/0002629 A1* | 1/2007 | Lee ........................ | G11C 16/08 365/185.19 |
| 2017/0271025 A1* | 9/2017 | Suzuki ............... | G11C 16/0483 |
| 2021/0065812 A1* | 3/2021 | An ......................... | G11C 16/24 |
| 2023/0060080 A1* | 2/2023 | Cho ........................ | G11C 7/106 |

FOREIGN PATENT DOCUMENTS

| | | |
|---|---|---|
| KR | 10-2013-0142408 A | 12/2013 |
| KR | 10-2122239 B1 | 6/2020 |
| KR | 10-2021-0024916 A | 3/2021 |

* cited by examiner

*Primary Examiner* — Huan Hoang
*Assistant Examiner* — Minh Dinh
(74) *Attorney, Agent, or Firm* — IP & T GROUP LLP

(57) ABSTRACT

A memory device includes: a plurality of page buffers connected a plurality of bit lines and configured to selectively precharge the bit lines, and a control circuit configured to: perform a first verify operation by applying a precharge voltage to a first bit line among the bit lines according to program data and by applying a first verify voltage to a selected word line, perform a second verify operation, after the first verify operation, by applying the precharge voltage to a second bit line not overlapping the first bit line and by applying a second verify voltage to the selected word line, and perform at least one of an operation of floating the first bit line and an operation of applying the precharge voltage according to a threshold voltage of a memory cell connected to the first bit line during the second verify operation.

13 Claims, 9 Drawing Sheets

MEMORY DEVICE FOR EFFECTIVELY CHECKING PROGRAM STATE AND OPERATION METHOD THEREOF

CROSS-REFERENCE TO RELATED APPLICATION

This application claims priority under 35 U.S.C. § 119 to Korean Patent Application No. 10-2022-0093789 filed on Jul. 28, 2022, which is incorporated herein by reference in its entirety.

BACKGROUND

1. Field

Various embodiments of the present disclosure relate to a semiconductor design, and particularly, to a memory device for effectively checking a program state and an operation method thereof.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

In general, an array of memory cells in a NAND flash memory is arranged so that control gates of memory cells in a row of the array are connected together to form an access line, such as a word line. A column of the array includes a string of memory cells (also referred to as a NAND string) connected together in series between a pair of select gates, for example, a source select transistor and a drain select transistor. Each source select transistor may be connected to a source, while each drain select transistor may be connected to a data line, such as a column bit line. A variation in which two or more select gates are used between the string of the memory cells and the source and/or between the string of the memory cells and the data line is known.

Programming in the NAND flash memory is generally accomplished by applying a plurality of programming pulses separated by a program verify pulse, and programming each memory cell of a selected group of memory cells to each intended data state which may be an intermediate or final data state. In this way, the programming pulse is applied to a selected word line. After each of the plurality of programming pulses is applied, one or more program verify pulses are used to verify programming of memory cells connected to the selected word line. Current programming generally uses many programming pulses in an incremental step pulse programming (ISPP) scheme, and each programming pulse is a single pulse that shifts a memory cell threshold voltage by a constant amount.

SUMMARY

Various embodiments of the present disclosure are directed to providing a nonvolatile memory device capable of minimizing a bit line precharge time during a program verify operation for checking the state of a program operation, and an operation method thereof.

Technical problems to be achieved in the present disclosure are not limited to the aforementioned technical problems and the other unmentioned technical problems will be clearly understood by those skilled in the art from the following description.

An aspect of an embodiment in the present disclosure includes a memory device which includes: a plurality of page buffers connected to a plurality of memory cells through a plurality of bit lines and configured to selectively precharge the bit lines; and a control circuit configured to: perform a first verify operation by applying a precharge voltage to at least one first bit line among the bit lines according to program data and by applying a first verify voltage to a selected word line, perform a second verify operation, after the first verify operation, by applying the precharge voltage to at least one second bit line not overlapping the first bit line and by applying a second verify voltage to the selected word line, and perform at least one of an operation of floating the first bit line and an operation of applying the precharge voltage according to a threshold voltage of a memory cell connected to the first bit line during the second verify operation.

An aspect of an embodiment in the present disclosure includes an operation method of a memory device, the operation method which includes: sequentially applying a plurality of program voltages to a selected word line until a program is completed; performing a first verify operation by applying a precharge voltage to at least one selected first bit line according to program data and by applying a first verify voltage to the selected word line in a program verify period between applying a consecutive first program voltage and a second program voltage among the plurality of program voltages; performing a second verify operation, after the first verify operation in the program verify period, by applying the precharge voltage to at least one second bit line not overlapping the first bit line and selected according to the program data and by applying a second verify voltage to the selected word line; and performing at least one of an operation of floating the first bit line and an operation of applying the precharge voltage according to a threshold voltage of a memory cell connected to the first bit line during the second verify operation.

An aspect of an embodiment in the disclosure includes a memory device which includes: a plurality of page buffers connected to a plurality of memory cells through a plurality of bit lines and configured to selectively precharge the bit lines; and a control circuit configured to perform a first operation by applying a precharge voltage to at least one first bit line among the bit lines and applying a first voltage to a selected word line, to perform a second operation, after the first operation, by applying the precharge voltage to at least one second bit line not overlapping the first bit line and applying a second voltage to the selected word line, and to perform at least one of an operation of floating the first bit line and an operation of applying the precharge voltage according to a threshold voltage of a memory cell connected to the first bit line during the second operation.

An aspect of an embodiment in the disclosure includes an operating method of a memory device, which includes performing a program operation and a verification operation on memory cells coupled to a selected word line during a program loop, wherein the verification operation may include: a first operation of applying a precharge voltage to a first bit line of bit lines coupled to the respective memory cells while applying a first verify voltage to the selected word line; and a second operation of: applying the precharge voltage to a second bit line of the bit lines while applying a second verify voltage to the selected word line; floating the first bit line when the memory cell coupled to the first bit line is determined as having a threshold voltage higher than the second verify voltage; and applying the precharge voltage to the first bit line when the memory cell is determined as having the threshold voltage lower than the second verify voltage. The first verify voltage may be higher than the second verify voltage.

According to the present technology, in a program verify operation for checking the state of a program operation, a precharge operation period for a bit line group selected first among at least two groups of bit lines continuously selected not to overlap each other according to program data may be allowed to overlap a precharge operation period for a bit line group selected later.

Furthermore, according to the present technology, in a program verify operation for checking the state of the program operation, verify voltages may be used in order from a verify voltage having a relatively high level to a verify voltage having a low level.

Accordingly, current consumption may be minimized while minimizing the time required for precharging a bit line.

DETAILED DESCRIPTION

Figure 1:
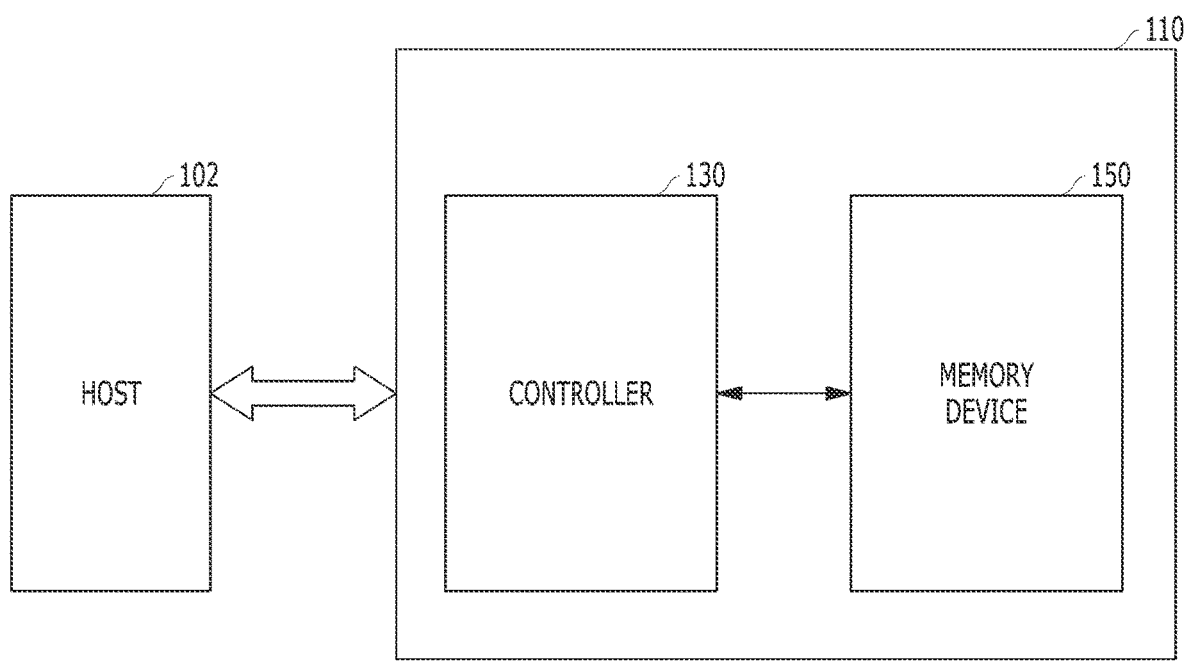
FIG. 1 is a diagram for describing a memory system in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram for describing a memory system 110 in accordance with an embodiment of the present disclosure.

Referring to FIG. 1, the data processing system 100 may include a host 102 engaged or operably coupled with the memory system 110.

The memory system 110 operates in response to a request of the host 102, and, in particular, stores data to be accessed by the host 102. The memory system 110 may be used as a main memory device or an auxiliary memory device of the host 102.

The memory system 110 may include a controller 130 and a memory device 150. The memory device 150 may store data to be accessed by the host 102. The controller 130 may control an operation of storing data in the memory device 150.

The controller 130 and the memory device 150 included in the memory system 110 may be integrated into a single semiconductor device.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk.

The memory device 150 may be a nonvolatile memory device and may retain data stored therein even while electrical power is not supplied. The memory device 150 may store data provided by the host 102 through a write operation and provide data stored therein to the host 102 through a read operation.

The memory cell array may include a plurality of memory blocks. Each memory block may include a plurality of memory cells. One memory block may include a plurality of pages. In an embodiment, each page may be a unit by which data is stored in the memory device 150 or by which data stored in the memory device 150 is read.

A memory block may be a unit by which data is erased. In an embodiment, the memory device 150 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on that the memory device 150 is a NAND flash memory.

The memory device 150 may receive a command and an address from the controller 130, and may access the area of the memory cell array, selected by the address. That is, the memory device 150 may perform an operation indicated by the command on the area selected by the address. For example, the memory device 150 may perform a write operation (i.e., program operation), a read operation, and an erase operation. During a program operation, the memory device 150 may program data to the area selected by the address. During a read operation, the memory device 150 may read data from the area selected by the address. During an erase operation, the memory device 150 may erase data stored in the area selected by the address.

The controller 130 controls the overall operation of the memory system 110.

In an embodiment, the controller 130 may receive data and a logical block address (LBA) from the host 102, and may translate the logical block address into a physical block address (PBA) indicating the address of memory cells which are included in the memory device 150 and in which data is to be stored.

In this specification, a logical block address (LBA) and a "logical address" may be used as having the same meaning. In this specification, a physical block address (PBA) and a "physical address" may be used as having the same meaning.

The controller 130 may control the memory device 150 so that a program operation, a read operation, or an erase operation is performed in response to a request received from the host 102. During a program operation, the controller 130 may provide a program command, a physical block address, and data to the memory device 150.

During a read operation, the controller 130 may provide a read command and a physical block address to the memory device 150. During an erase operation, the controller 130 may provide an erase command and a physical block address to the memory device 150.

In an embodiment, the controller 130 may autonomously generate a command, an address, and data regardless of a request from the host 102, and may transmit the command, the address, and the data to the memory device 150. For example, the controller 130 may provide commands, addresses, and data to the memory device 150 to perform background operations, such as a program operation for wear leveling and a program operation for garbage collection.

In an embodiment, the controller 130 may control two or more memory devices 100. In such case, the controller 130 may control the memory devices 100 depending on an interleaving scheme to improve operating performance. The interleaving scheme may be an operating manner in which the operating periods of the at least two memory devices 100 are caused to overlap each other.

Figure 2:
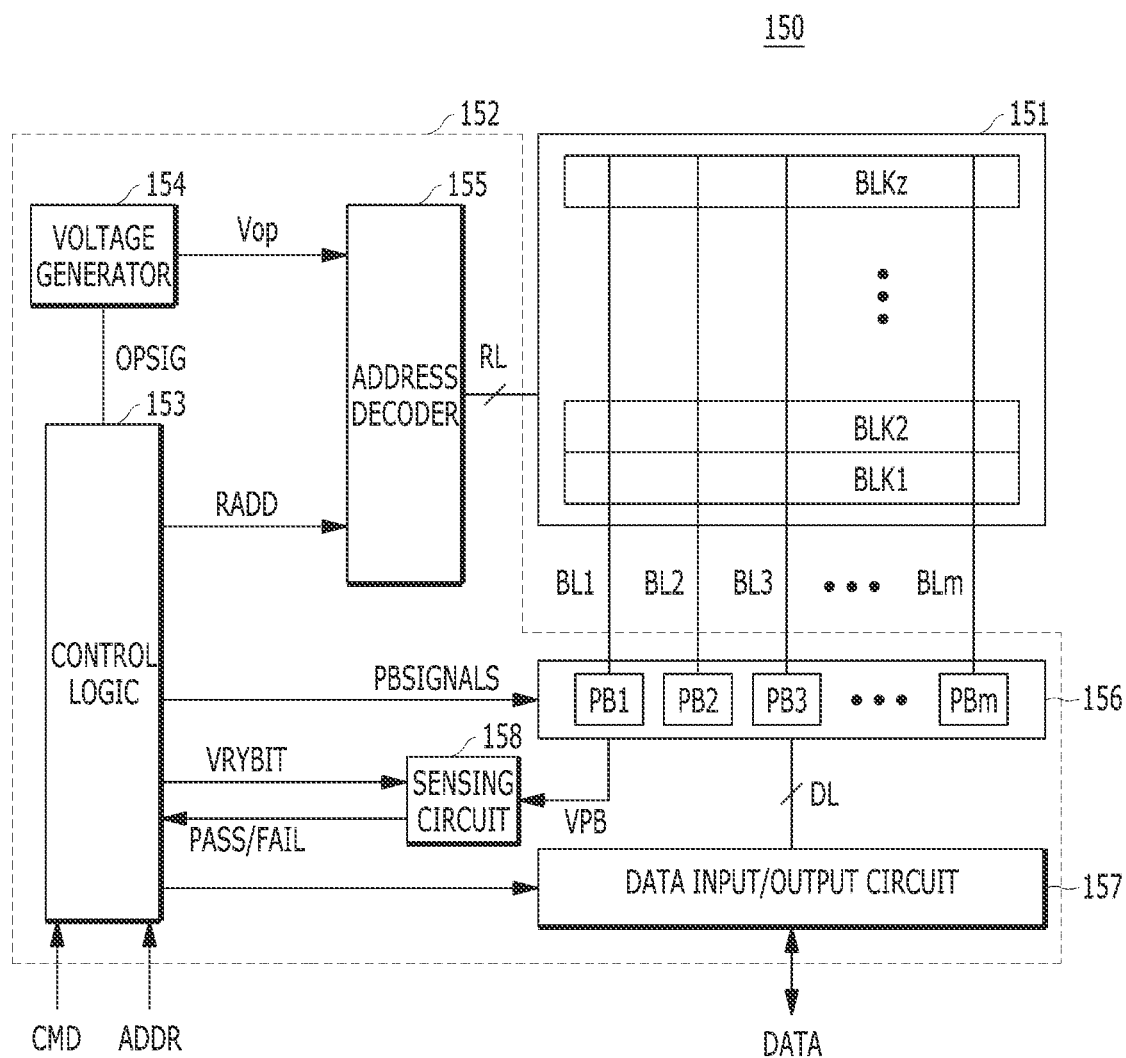
FIG. 2 is a diagram for describing in detail a memory device illustrated in FIG. 1 in accordance with an embodiment of the present disclosure.

FIG. 2 is a diagram for describing in detail a memory device illustrated in FIG. 1 in accordance with an embodiment of the present disclosure.

Referring to FIG. 2, the memory device 150 may include a memory cell array 151 and a control circuit 152.

The memory cell array 151 may include a plurality of memory blocks BLK1 to BLKz. The plurality of memory blocks BLK1 to BLKz may be connected to an address decoder 155 through a row line RL. The plurality of memory blocks BLK1 to BLKz may be connected to a page buffer group 156 through bit lines BL1 to BLm. Each of the memory blocks BLK1 to BLKz may include a plurality of memory cells. In an embodiment, the plurality of memory cells may be nonvolatile memory cells. Memory cells connected to the same word line may be defined as one page. Accordingly, one memory block may include a plurality of pages.

The row line RL may include at least one source selection line, a plurality of word lines and at least one drain selection line.

That is, the memory cells included in the memory cell array 151 may be connected between the plurality of word lines and the plurality of bit lines BL1 to BLm.

In the present disclosure, the following description will be provided on that the memory cells included in the memory cell array 151 store at least two data bits. For example, in the present disclosure, the memory cells included in the memory cell array 151 may be multi-level cells, triple-level cells, or quad-level cells.

The memory cells included in the memory cell array 151 may be configured as single level cells (SLCs) each storing 1-bit data, multi-level cells (MLCs) each storing 2-bit data, triple level cells (TLCs) each storing 3-bit data or quad level cells (QLCs) each storing 4-bit data.

The control circuit 152 may be configured to perform a program, read or erase operation on a selected region of the memory cell array 151. The control circuit 152 may drive the memory cell array 151. For example, the control circuit 152 may apply various operating voltages to the row line RL and the bit lines BL1 to BLm, or discharge the applied voltages.

The control circuit 152 may include the address decoder 155, a voltage generator 154, the page buffer group 156, a data input/output circuit 157, a sensing circuit 158 and a control logic 153.

The control circuit 152 may drive the memory cell array 151. For example, the control circuit 152 may drive the memory cell array 151 to perform the program, read and erase operations.

The address decoder 155 may be connected to the memory cell array 151 through the row line RL. The row line RL may include the drain selection line, the word lines, the source selection line and a common source line.

The address decoder 155 may be configured to operate in response to the control of the control logic 153. The address decoder 155 may receive an address RADD from the control logic 153.

The address decoder 155 may be configured to decode a block address of the received address RADD. The address decoder 155 may select at least one memory block among the memory blocks BLK1 to BLKz according to the decoded block address. The address decoder 155 may be configured to decode a row address of the received address RADD. The address decoder 155 may select at least one word line among word lines of the selected memory block according to the decoded row address. The address decoder 155 may apply operating voltages Vop, which are supplied from the voltage generator 154, to the selected word line.

During the program operation, the address decoder 155 may apply a program voltage to the selected word line, and apply a pass voltage having a lower level than the program voltage to an unselected word line. During a program verification operation, the address decoder 155 may apply a verification voltage to the selected word line, and apply a verification pass voltage having a higher level than the verification voltage to the unselected word line.

During the read operation, the address decoder 155 may apply a read voltage to the selected word line, and apply a read pass voltage having a higher level than the read voltage to the unselected word line.

The erase operation of the memory device 150 may be performed in units of memory blocks. An address ADDR inputted to the memory device 150 during the erase operation may include a block address. The address decoder 155 may decode the block address, and select at least one memory block according to the decoded block address. During the erase operation, the address decoder 155 may apply a ground voltage to a word line of the selected memory block.

The voltage generator 154 may be configured to generate a plurality of operating voltages Vop by using an external power supply voltage supplied to the memory device 150. The voltage generator 154 may operate in response to the control of the control logic 153.

In an embodiment, the voltage generator 154 may regulate the external power supply voltage, and generate an internal power supply voltage. The internal power supply voltage generated by the voltage generator 154 may be used as an operating voltage of the memory device 150.

In an embodiment, the voltage generator 154 may generate the plurality of operating voltages Vop by using the external power supply voltage or the internal power supply voltage. The voltage generator 154 may be configured to generate various voltages required by the memory device 150. For example, the voltage generator 154 may generate a plurality of erase voltages, a plurality of program voltages, a plurality of pass voltages, a plurality of selective read voltages and a plurality of unselective read voltages.

The voltage generator 154 may include a plurality of pumping capacitors, which receive the internal power supply voltage, to generate the plurality of operating voltages Vop having various voltage levels, and generate the plurality of operating voltages Vop by selectively activating the plurality of pumping capacitors in response to the control of the control logic 153.

The generated operating voltages Vop may be supplied to the memory cell array 151 by the address decoder 155.

The page buffer group 156 may include a plurality of page buffers PB1 to PBm. The plurality of page buffers PB1 to PBm may be connected to the memory cell array 151 through the plurality of bit lines BL1 to BLm, respectively. The plurality of page buffers PB1 to PBm may operate in response to the control of the control logic 153.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

During the program operation, the plurality of page buffers PB1 to PBm may transmit the data DATA, which is received through the data input/output circuit 157, to the selected memory cell through the bit lines BL1 to BLm when the program voltage is applied to the selected word line. Memory cells of a selected page may be programmed according to the transmitted data DATA. A memory cell connected to a bit line to which a program allowable voltage, for example, a ground voltage, is applied may have a raised threshold voltage. A threshold voltage of a memory cell connected to a bit line to which a program inhibited voltage, for example, a power supply voltage, is applied may be maintained.

During the program verify operation, the plurality of page buffers PB1 to PBm may verify whether the threshold voltage levels of the memory cells connected through the bit lines BL1 to BLm each have reached a target threshold voltage level. More specifically, during the program verify operation, the plurality of page buffers PB1 to PBm may apply a precharge voltage to the bit lines BL1 to BLm, and then sense changes in the voltage levels of the bit lines BL1 to BLm according to the threshold voltage level of the memory cells connected to the bit lines BL1 to BLm, thereby verifying whether the threshold voltage levels of the memory cells connected through the bit lines BL1 to BLm each have reached the target threshold voltage level.

During the read operation, the page buffer group 156 may read the data DATA from the memory cell of the selected page through the bit lines BLs, and store the read data DATA in the plurality of page buffers PB1 to PBm.

During the erase operation, the page buffer group 156 may float the bit lines BLs. In an embodiment, the page buffer group 156 may include a column selection circuit.

The data input/output circuit 157 may be connected to the plurality of page buffers PB1 to PBm through the data line DL. The data input/output circuit 157 may operate in response to the control of the control logic 153.

The data input/output circuit 157 may include a plurality of input/output buffers (not illustrated) that receive the data DATA inputted thereto. During the program operation, the data input/output circuit 157 may receive the data DATA to be stored from the controller 130 (refer to FIG. 1). The data input/output circuit 157 may output the data DATA, which is transmitted from the plurality of page buffers PB1 to PBm included in the page buffer group 156, to the controller 130 (refer to FIG. 1) during the read operation.

During the read operation or the verification operation, the sensing circuit 158 may generate a reference current in response to an allowable bit VRYBIT generated by the control logic 153, and output a pass signal PASS or a fail signal FAIL to the control logic 153 by comparing a sensing voltage VPB received from the page buffer group 156 with a reference voltage attributable to the reference current.

The control logic 153 may be connected to the address decoder 155, the voltage generator 154, the page buffer group 156, the data input/output circuit 157 and the sensing circuit 158. The control logic 153 may be configured to control overall operations of the memory device 150. The control logic 153 may operate in response to a command CMD transmitted from an external device.

The control logic 153 may generate various signals in response to the command CMD and the address ADDR, and control the other components 154 to 158 included in the control circuit 152. For example, the control logic 153 may generate an operation signal OPSIG, the address RADD, read and write circuit control signals PBSIGNALS and the allowable bit VRYBIT in response to the command CMD and the address ADDR. The control logic 153 may output the operation signal OPSIG to the voltage generator 154, output the address RADD to the address decoder 155, output the read and write control signals PBSIGNALS to the page buffer group 156, and output the allowable bit VRYBIT to the sensing circuit 158. In addition, the control logic 153 may determine whether the verification operation has passed or failed, in response to the pass or fail signal PASS or FAIL outputted by the sensing circuit 158.

Figure 3:
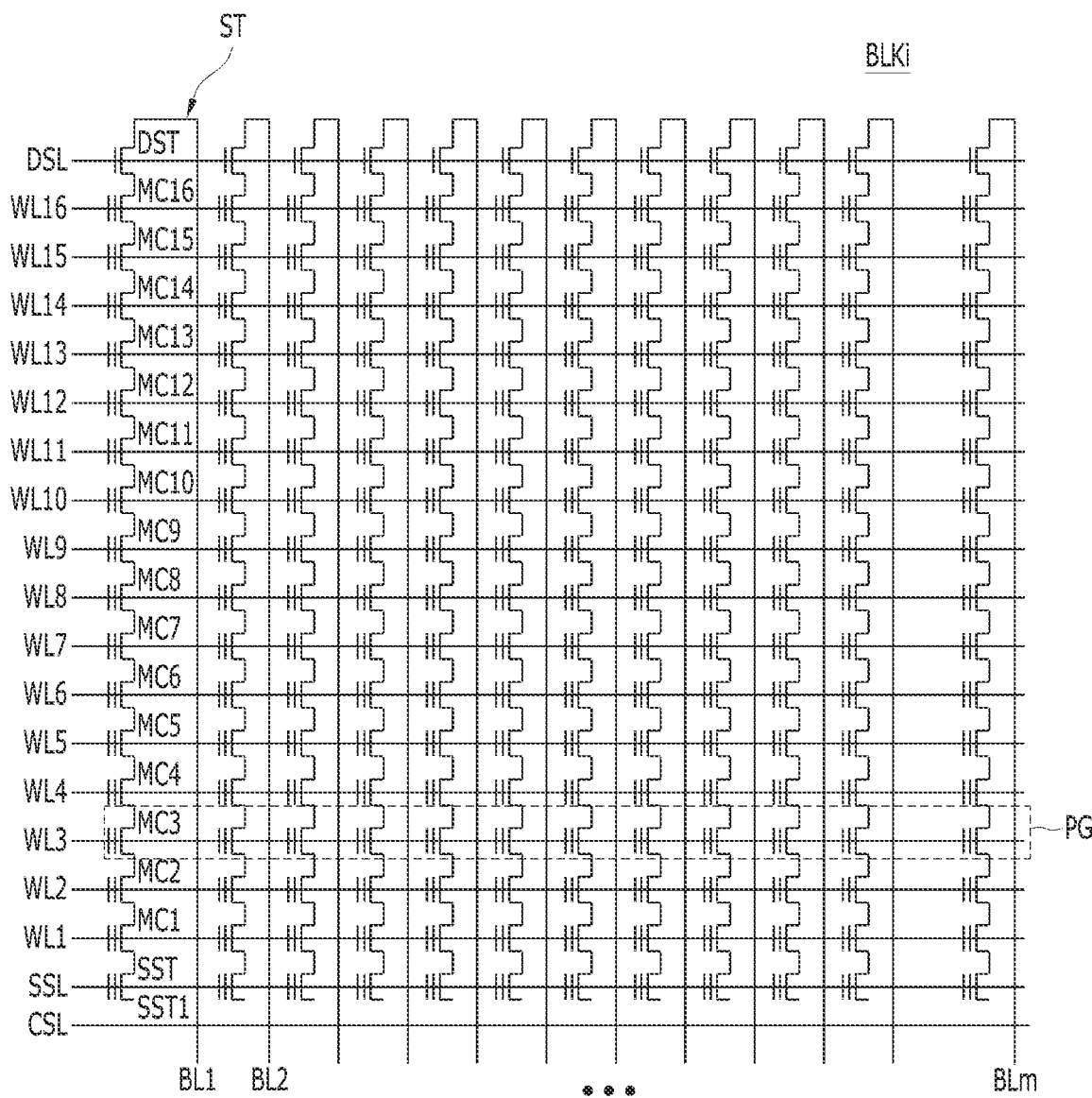
FIG. 3 is a diagram for describing in detail a memory block illustrated in FIG. 2 in accordance with an embodiment of the present disclosure.

FIG. 3 is a diagram for describing in detail a memory block illustrated in FIG. 2 in accordance with an embodiment of the present disclosure.

Referring to FIG. 3, a plurality of word lines arranged in parallel with one another may be connected between a first selection line and a second selection line. The first selection line may be a source selection line SSL, and the second selection line may be a drain selection line DSL. More specifically, a memory block BLKi may include a plurality of memory cell strings ST connected between the bit lines BL1 to BLm and a common source line CSL. The bit lines BL1 to BLm may be connected to the memory cell strings ST, respectively, and the common source line CSL may be connected to the memory cell strings ST in common. Since the memory cell strings ST may have the same configuration, the memory cell string ST connected to the first bit line BL1 is representatively described in detail.

The memory cell string ST may include a source selection transistor SST, a plurality of memory cells MC1 to MC16 and a drain selection transistor DST connected in series between the common source line CSL and the first bit line BL1. At least one drain selection transistor DST may be included in one memory cell string ST, and more source selection transistors SST and memory cells MC1 to MC16 may be included than illustrated in the drawing.

A source of the source selection transistor SST may be connected to the common source line CSL, and a drain of the drain selection transistor DST may be connected to the first bit line BL1. The memory cells MC1 to MC16 may be connected in series between the source selection transistor SST and the drain selection transistor DST. Gates of the source selection transistors SST included in different memory cell strings ST may be connected to the source selection line SSL, gates of the drain selection transistors DST included in different memory cell strings ST may be connected to the drain selection line DSL, and gates of the memory cells MC1 to MC16 may be connected to a plurality of word lines WL1 to WL16, respectively. A group of memory cells connected to the same word line among memory cells included in different memory cell strings ST may be referred to as a physical page PG. Accordingly, as many physical pages PG as the number of word lines WL1 to WL16 may be included in the memory block BLKi.

One memory cell may store 1-bit data. This is commonly referred to as a single level cell (SLC). In this case, one physical page PG may store one logical page (LPG) data. One logical page (LPG) data may include as many data bits as the number of cells included in one physical page PG.

One memory cell may store two or more bits of data. In this case, one physical page PG may store two or more logical page (LPG) data.

Figure 4:
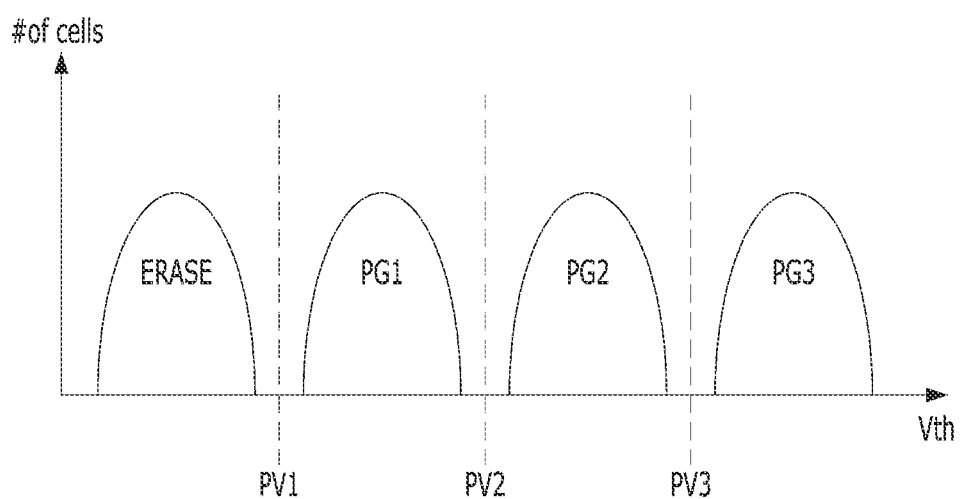
FIG. 4 is a diagram for describing a threshold voltage distribution of a multi-level cell storing two data bits.

FIG. 4 is a diagram for describing a threshold voltage distribution of a multi-level cell storing two data bits.

Referring to FIG. 4, when the plurality of memory cells included in the memory cell array 151 are multi-level cells each storing two data bits, each of the plurality of memory cells may have an erase state ERASE and three program states PG1 to PG3.

The threshold voltage levels of the memory cells in the erase state ERASE may be lower than a first voltage (PV1) level, the threshold voltage levels of the memory cells in a first program state PG1 may be higher than the first voltage (PV1) level and lower than a second voltage (PV2) level, the threshold voltage levels of the memory cells in a second program state PG2 may be higher than the second voltage (PV2) level and lower than a third voltage (PV3) level, and the threshold voltage levels of the memory cells in a third program state PG3 may be higher than the third voltage (PV3) level. The erase state ERASE and the first to third program states PG1 to PG3 indicate states in which data having different values are stored in the memory cells.

The first to third voltage (PV1 to PV3) levels may be reference voltages for discriminating whether a memory cell is in the erase state ERASE, the first program state PG1, the second program state PG2, or the third program state PG3. Accordingly, a sensing operation using the first to third voltages PV1 to PV3 may be performed when verifying whether a memory cell has been properly programmed or when reading data stored in the memory cell.

Figure 5:
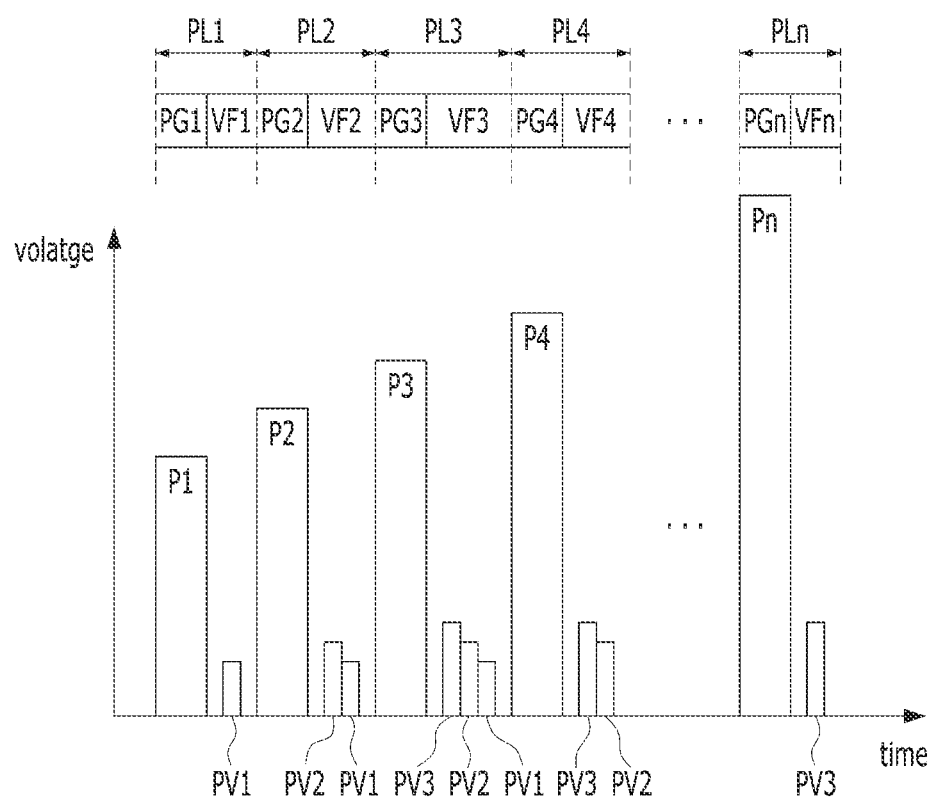
FIG. 5 to FIG. 7 are diagrams for describing an example of a program verify operation in accordance with an embodiment of the present disclosure.
Figure 6:
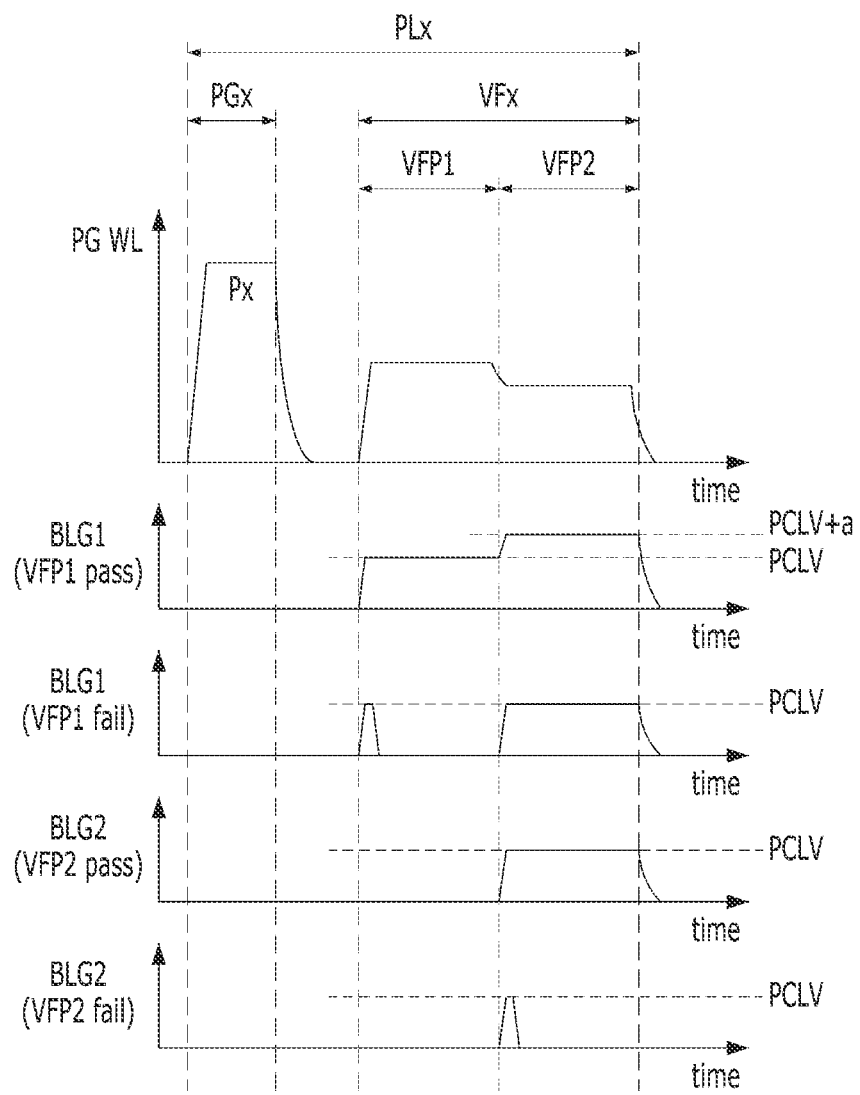
Figure 7:
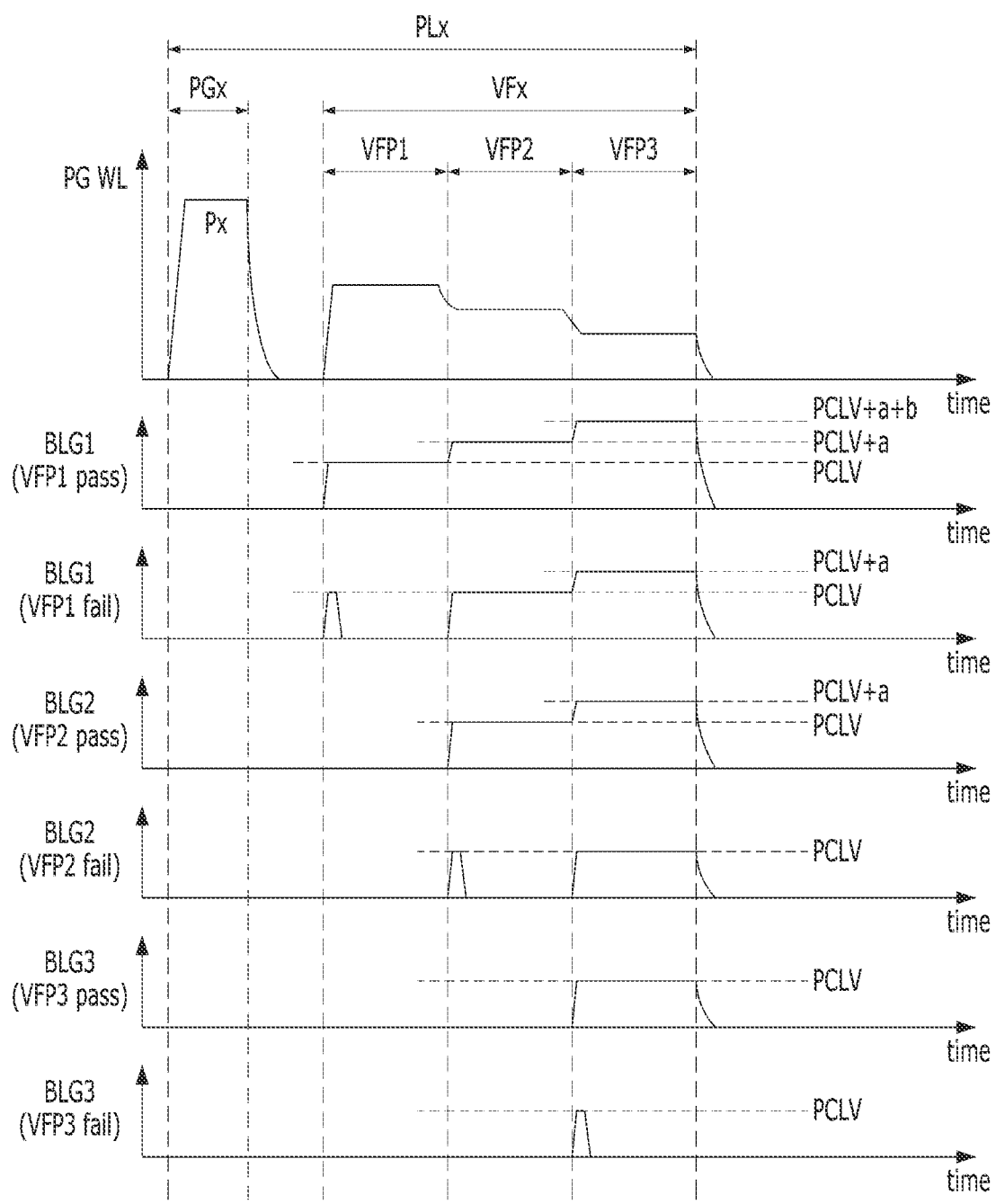

FIG. 5 to FIG. 7 are diagrams for describing an example of the program verify operation in accordance with an embodiment of the present disclosure.

Referring to FIG. 5, a program operation in accordance with an embodiment of the present disclosure may include a plurality of program operations PL1 to PLn. That is, the program operation in accordance with the embodiment of the present disclosure may be performed in an incremental step pulse programming (ISPP) scheme. The ISPP program operation may refer to an operation of sequentially performing the plurality of program operations PL1 to PLn one by one according to a set order until the program is completed and programming a selected memory cell so that the memory cell has one of a plurality of program states. In such a case, when the program is not completed within a preset number of program operations, the ISPP program operation may be determined as fail. When the program is completed within the preset number of program operations, the ISPP program operation may be determined as pass. Whether the programming is completed may be determined by whether a program verify operation for memory cells having a predetermined ratio or more among memory cells selected as program targets has been passed.

Each of the plurality of program operations PL1 to PLn may include program voltage application periods PG1 to PGn in each of which a program voltage is applied to a selected word line, and program verify periods VF1 to VFn in each of which it is determined whether a memory cell has been programmed by applying a voltage for verification to the selected word line.

In the program voltage application periods PG1 to PGn, a program voltage application operation of applying program voltages P1 to Pn to the selected word line may be performed. The selected memory cell may be programmed to one of a plurality of program states by the program voltage application operation.

According to an embodiment, as the plurality of program operations PL1 to PLn are sequentially performed in the ISPP program operation, potential levels of the program voltages P1 to Pn may be increased. That is, as the plurality of program operations PL1 to PLn are sequentially performed, the levels of the program voltages P1 to Pn may be stepwise increased, maintained, or decreased by a predetermined voltage increment. The number of times of application, voltage levels, voltage application times, and the like of the program voltages P1 to Pn used in each of the plurality of program operations PL1 to PLn may be variously determined according to the control of the control logic 153.

The program voltages P1 to Pn may be applied to the selected word line. A pass voltage may be applied to remaining unselected word lines other than the selected word line. The memory cell array 151 may include a plurality of memory blocks, and each of the plurality of memory blocks may include a plurality of word lines. Accordingly, a program voltage may be applied to a selected word line among a plurality of word lines included in one memory block selected as a program target, and a pass voltage may be applied to the remaining unselected word lines.

A program enable voltage may be applied to a selected bit line connected to a memory cell selected as a program target. A program inhibit voltage may be applied to an unselected bit line connected to a memory cell other than the memory cell selected as a program target. According to an embodiment, the program enable voltage may be a ground voltage VSS, and the program inhibit voltage may be a power supply voltage VCORE.

In the program verify periods VF1 to VFn, a bit line precharge operation for precharging each of the plurality of bit lines BL1 to BLm to a set potential level, for example, a program enable potential level or a program inhibit potential level may be performed. In this way, in a state in which the plurality of bit lines BL1 to BLm are precharged through the bit line precharge operation, a bit line sensing operation of detecting a voltage or current change in each of the plurality of precharged bit lines BL1 to BLm by applying a verify voltage to the selected word line may be performed, and verification pass or fail of the plurality of memory cells connected between the selected word line and the plurality of bit lines BL1 to BLm may be determined on the basis of the sensed result.

In the program verify periods VF1 to VFn, a program verify operation for at least one program state among a plurality of program states may be performed. For example, when a memory cell to be programmed in a $k^{th}$ program state (k is a natural number equal to or greater than 1) is read as an off-cell by a verify voltage corresponding to the $k^{th}$ program state, the program verify operation for the $k^{th}$ state may be passed.

In the present disclosure, a blind verify method may be used in the program verify periods VF1 to VFn.

In such a case, the blind verify method may be applied when a memory cell selected as a program target is a multi-level cell storing at least two data bits.

According to an embodiment, when the memory cell selected as a program target is a multi-level cell storing two data bits as described with reference to FIG. 4, the selected memory cell may be programmed to any of the erase state ERASE and the first to third program states PG1 to PG3. Accordingly, the verify operation may be performed on the basis of a total of three voltages, that is, the first to third voltages PV1 to PV3. In this way, in a case where the verify operation is performed on the basis of three voltages PV1 to PV3, when the blind verification method is not used, whenever the program verify periods VF1 to VFn are entered, three program verify operations, that is, a program verify operation using the first voltage PV1, a program verify operation using the second voltage PV2, and a program verify operation using the third voltage PV3 need to be performed individually.

However, when all memory cells included in the selected word line are in the erase state ERASE, a cell programmed with the second voltage (PV2) level and the third voltage (PV3) level or higher may not occur in the first program operation PL1 among the plurality of program operations PL1 to PLn. Accordingly, in order to shorten the time required for the program verify operation, only a program verify operation based on the first voltage (PV1) level may be performed in a program verify period included in a predetermined initial number of program operations among the plurality of program operations (PL1 to PLn) without performing program verify operations based on the second voltage (PV2) level and the third voltage (PV3) level.

Furthermore, in a program verify period included in a predetermined middle number of program operations among the plurality of program operations (PL1 to PLn), the program verify operations based on the second voltage (PV2) level and the third voltage (PV3) level or only a program verify operation based on the third voltage (PV3) level may be performed without performing the program verify operation based on the first voltage (PV1) level. As described above, when some of the program verify operations are omitted, it is called a blind verify method.

As described above, since the present disclosure uses the blind verify method, one or more of the first to third voltages PV1 to PV3 may be sequentially applied for the verify operation in each of the program verify periods VF1 to VFn. In such a case, a memory cell having the first program state as a target state may be verified by the first voltage PV1, a memory cell having the second program state as a target state may be verified by the second voltage PV2, and a memory cell having the third program state as a target state may be verified by the third voltage PV3.

Memory cells verification-passed by the first to third voltages PV1 to PV3, respectively, may be each determined to have a target state, and may be switched to a program inhibit state in a subsequent program voltage application period. A program inhibit voltage may be applied to a bit line connected to a program-inhibited memory cell, in a subsequent program voltage application period. For example, the verification pass indicates that a memory cell is read as an off-cell by a corresponding verify voltage.

According to an embodiment, as illustrated in FIG. 5, when the first program operation PL1 is performed, after the first program voltage P1 is applied, only the lowest first voltage PV1 among the first to third voltages PV1 to PV3 for verifying the program states of the plurality of memory cells may be used for the verify operation. Through the first program operation PL1, whether the threshold voltage levels of the memory cells having the first to third program states PG1 to PG3 as target states among the plurality of memory cells are higher than the first voltage (PV1) level may be verified. In such a case, when the verification by the first voltage PV1 is passed in the memory cell having the first program state PG1 as a target state among the plurality of memory cells, the corresponding memory cell may be determined to have a target state, and may be switched to a program inhibit state in the subsequent remaining program operations PL2 to PLn. Furthermore, when the verification by the first voltage PV1 is failed in the memory cell having the first program state PG1 as a target state among the plurality of memory cells, the corresponding memory cell may be determined not to have a target state, and the second program voltage P2 may be applied in the subsequent second program operation PL2. Furthermore, the memory cells having the second and third program states PG2 and PG3 as target states among the plurality of memory cells may be determined not to have a target state regardless of the result of the verification by the first voltage PV1, and the second program voltage P2 may be applied in the subsequent second program operation PL2.

In the present disclosure, in each of the program verify periods VF1 to VFn, when at least two verify operations are sequentially performed using at least two voltages, a voltage having a relatively high level may be used for a relatively advanced verify operation. For example, when two verify operations using the first voltage PV1 and the second voltage PV2 need to be sequentially performed in a specific program verify period VFx, a verify operation using the second voltage PV2 having a relatively high level may be first performed and then a verify operation may be performed using the first voltage PV1 having a relatively low level.

According to an embodiment, as illustrated in FIG. 5, when the second program operation PL2 is performed, after the second program voltage P2 is applied, only the first and second voltages PV1 and PV2 among the first to third voltages PV1 to PV3 for verifying the program states of the plurality of memory cells may be used for the verify operation. In such a case, after the verify operation using the second voltage PV2 is performed, the verify operation using the first voltage PV1 may be subsequently performed. Through the second program operation PL2, whether the threshold voltage levels of the memory cells having the second and third program states PG2 and PG3 as target states among the plurality of memory cells are higher than the second voltage (PV2) level and whether the threshold voltage level of the memory cell having the first program state PG1 as a target state is higher than the first voltage (PV1) level may be verified. In such a case, when the verification by the second voltage PV2 is passed in the memory cell having the second program state PG2 as a target state among the plurality of memory cells and when the verification by the first voltage PV1 is passed in the memory cell having the first program state PG1 as a target state among the plurality of memory cells, the corresponding memory cells may be determined to have target states, and may each be switched to a program inhibit state in the subsequent remaining program operations PL3 to PLn. Furthermore, when the verification by the second voltage PV2 is failed in the memory cell having the second program state PG2 as a target state among the plurality of memory cells and when the verification by the first voltage PV1 is failed in the memory cell having the first program state PG1 as a target state among the plurality of memory cells, the corresponding memory cells may be determined not to have target states, and the third program voltage P3 may be applied in the subsequent third program operation PL3. Furthermore, the memory cell having the third program state PG3 as a target state among the plurality of memory cells may be determined not to have a target state regardless of the result of the sequential verification by the second voltage PV2 and the first voltage PV1, and the third program voltage P3 may be applied in the subsequent third program operation PL3.

According to another embodiment, as illustrated in FIG. 5, when the third program operation PL3 is performed, after the third program operation PL3 is applied, all of the first to third voltages PV1 to PV3 for verifying the program states of the plurality of memory cells may be used for the verify operation. In such a case, after the verify operation using the third voltage PV3 is performed, the verify operation using the second voltage PV2 may be performed and then the verify operation using the first voltage PV1 may be performed. Through the third program operation PL3, whether the threshold voltage level of the memory cell having the third program state PG3 as a target state among the plurality of memory cells is higher than the third voltage (PV3) level, whether the threshold voltage level of the memory cell having the second program state PG2 as a target state is higher than the second voltage (PV2) level, and whether the threshold voltage level of the memory cell having the first program state PG1 as a target state is higher than the first voltage (PV1) level may be verified. In such a case, when the verification by the third voltage PV3 is passed in the memory cell having the third program state PG3 as a target state among the plurality of memory cells, when the verification by the second voltage PV2 is passed in the memory cell having the second program state PG2 as a target state among the plurality of memory cells, and when the verification by the first voltage PV1 is passed in the memory cell having the first program state PG1 as a target state among the plurality of memory cells, the corresponding memory cells may be determined to have target states, and may each be switched to a program inhibit state in the subsequent remaining program operations PL4 to PLn. Furthermore, when the verification by the third voltage PV3 has failed in the memory cell having the third program state PG3 as a target state among the plurality of memory cells, when the verification by the second voltage PV2 has failed in the memory cell having the second program state PG2 as the target state among the plurality of memory cells, and when the verification by the first voltage PV1 has failed in the memory cell having the first program state PG1 as a target state among the plurality of memory cells, the corresponding memory cells may be determined not to have target states, and the fourth program voltage P4 may be applied in the subsequent fourth program operation PL4.

According to still another embodiment, as illustrated in FIG. 5, when the fourth program operation PL4 is performed, after the fourth program voltage P4 is applied, only the second and third voltages PV3 and PV4 among the first to third voltages PV1 to PV3 for verifying the program states of the plurality of memory cells may be used for the verify operation. In such a case, after the verify operation using the third voltage PV3 is performed, the verify operation using the second voltage PV2 may be subsequently performed. Through the fourth program operation PL4, whether the threshold voltage level of the memory cell having the third program state PG3 as a target state among the plurality of memory cells is higher than the third voltage (PV3) level and whether the threshold voltage level of the memory cell having the second program state PG2 as a target state is higher than the second voltage (PV2) level may be verified. In such a case, when the verification by the third voltage PV3 is passed in the memory cell having the third program state PG3 as a target state among the plurality of memory cells and when the verification by the second voltage PV2 is passed in the memory cell having the second program state PG2 as a target state among the plurality of memory cells, the corresponding memory cells may be determined to have target states, and may each be switched to a program inhibit state in the subsequent remaining program operations PL5 to PLn. Furthermore, when the verification by the third voltage PV3 is failed in the memory cell having the third program state PG3 as a target state among the plurality of memory cells and when the verification by the second voltage PV2 is failed in the memory cell having the second program state PG2 as a target state among the plurality of memory cells, the corresponding memory cells may be determined not to have target states, and the fifth program voltage P5 may be applied in the subsequent fifth program operation PL5. Furthermore, the memory cell having the first program state PG1 as the target state among the plurality of memory cells may be determined to have a target state regardless of the result of the sequential verification by the third voltage PV3 and the second voltage PV2, and may be switched to a program inhibit state in the subsequent remaining program operations PL5 to PLn.

For reference, in the above-described embodiment, an operation using at least one of the three voltages PV1 to PV3 for verifying the program states of the plurality of memory cells has been described. However, this is merely an example, and actually, it is possible to verify the program state by using a larger number of voltages or a smaller number of voltages.

Hereinafter, characteristic operations of the program verify periods VF1 to VFn in accordance with an embodiment of the present disclosure will be described in detail.

First, the bit line precharge operation performed in the program verify periods VF1 to VFn may be divided into an 'entire bit line precharge method' of precharging all of the plurality of bit lines BL1 to BLm connected to the plurality of memory cells, and a 'selective bit line precharge method' of precharging only a selected bit line among the plurality of bit lines BL1 to BLm. In the present disclosure, the following description will be provided on that the 'selective bit line precharge method' is used.

Referring to FIG. 1 to FIG. 6, the page buffers PB1 to PBm in accordance with an embodiment of the present disclosure may selectively precharge the plurality of bit lines BL1 to BLm according to the 'selective bit line precharge method' in the program verify periods VF1 to VFn.

According to an embodiment, the control circuit 152 may set as an aim of the plurality of program operations PL1 to PLn that a memory cell connected to first bit lines BLG1 among the plurality of bit lines BL1 to BLm is programmed to the second program state PG2 and a memory cell connected to second bit lines BLG2 not overlapping the first bit lines BLG1 is programmed to the first program state PG1 according to the program data.

In such a case, the control circuit 152 may apply a specific program voltage Px to the selected word line in a specific program voltage application period PGx included in a specific program operation PLx among the plurality of program operations PL1 to PLn, and then may separately and sequentially perform a first verify operation VFP1 corresponding to the first bit lines BLG1 and a second verify operation VFP2 corresponding to the second bit lines BLG2 in the specific program verify period VFx included in the specific program operation PLx. For reference, the specific program operation PLx may mean any of the plurality of program operations PL1 to PLn.

That is, the control circuit 152 may perform the first verify operation VFP1 of verifying whether a memory cell connected between the selected word line and the first bit line BLG1 has been programmed to the second program state PG2 by applying a precharge voltage to the first bit line BLG1 selected before the second bit line BLG2 among the plurality of bit lines BL1 to BLm and applying the second voltage PV2 to the selected word line as a verify voltage according to the program data.

Furthermore, the control circuit 152 may perform the second verify operation VFP2 of verifying whether a memory cell connected between the selected word line and the second bit line BLG2 has been programmed to the first program state PG1 by applying a precharge voltage to the second bit line BLG2 selected after the first bit line BLG1 among the plurality of bit lines BL1 to BLm and applying the first voltage PV1 to the selected word line as a verify voltage according to the program data.

As described above, in the present disclosure, the control circuit 152 may perform the first verify operation VFP1 corresponding to the first bit line BLG1 in the specific program verify period VFx included in the specific program operation PLx, and then perform the second verify operation VFP2 corresponding to the second bit line BLG2.

Particularly, in the present disclosure, the control circuit 152 may not discharge the first bit line BLG1 after performing the first verify operation VFP1, and may float the first bit line BLG1 or apply a precharge voltage to the first bit line BLG1 during the subsequent second verify operation VFP2.

More specifically, the control circuit 152 may raise the voltage level of the first bit line BLG1 to a precharge voltage level PCLV through the bit line precharge operation at the start time of the previously performed first verify operation VFP1.

After raising the voltage level of the first bit line BLG1 to the precharge voltage level PCLV, the control circuit 152 may substantially maintain the precharge voltage level PCLV of a bit line of the first bit lines BLG1, to which a memory cell having a threshold voltage level higher than the second voltage (PV2) level is connected, during the first verify operation VFP1, thereby determining the result of the first verify operation VFP1 as a pass.

After raising the voltage level of the first bit line BLG1 to the precharge voltage level PCLV, the control circuit 152 may lower the voltage level of a bit line of the first bit lines BLG1, to which a memory cell having a threshold voltage level equal to or lower than the second voltage (PV2) level is connected, to a level lower than the precharge voltage level PCLV during the first verify operation VFP1, thereby determining the result of the first verify operation VFP1 as a fail.

Furthermore, the control circuit 152 may start the second verify operation VFP2 in a state in which the first bit line BLG1 is not discharged regardless of pass or fail of the first verify operation VFP1. That is, the control circuit 152 may perform the second verify operation VFP2 in substantially the same state as when both the first bit line BLG1 and the second bit line BLG2 are selected. In such a case, the control circuit 152 may mask a page buffer connected to the first bit line BLG1 among the plurality of page buffers PB1 to PBm during the second verify operation VFP2. That is, the control circuit 152 may not verify the program state of the memory cell connected to the first bit line BLG1 during the second verify operation VFP2.

Figure 8:
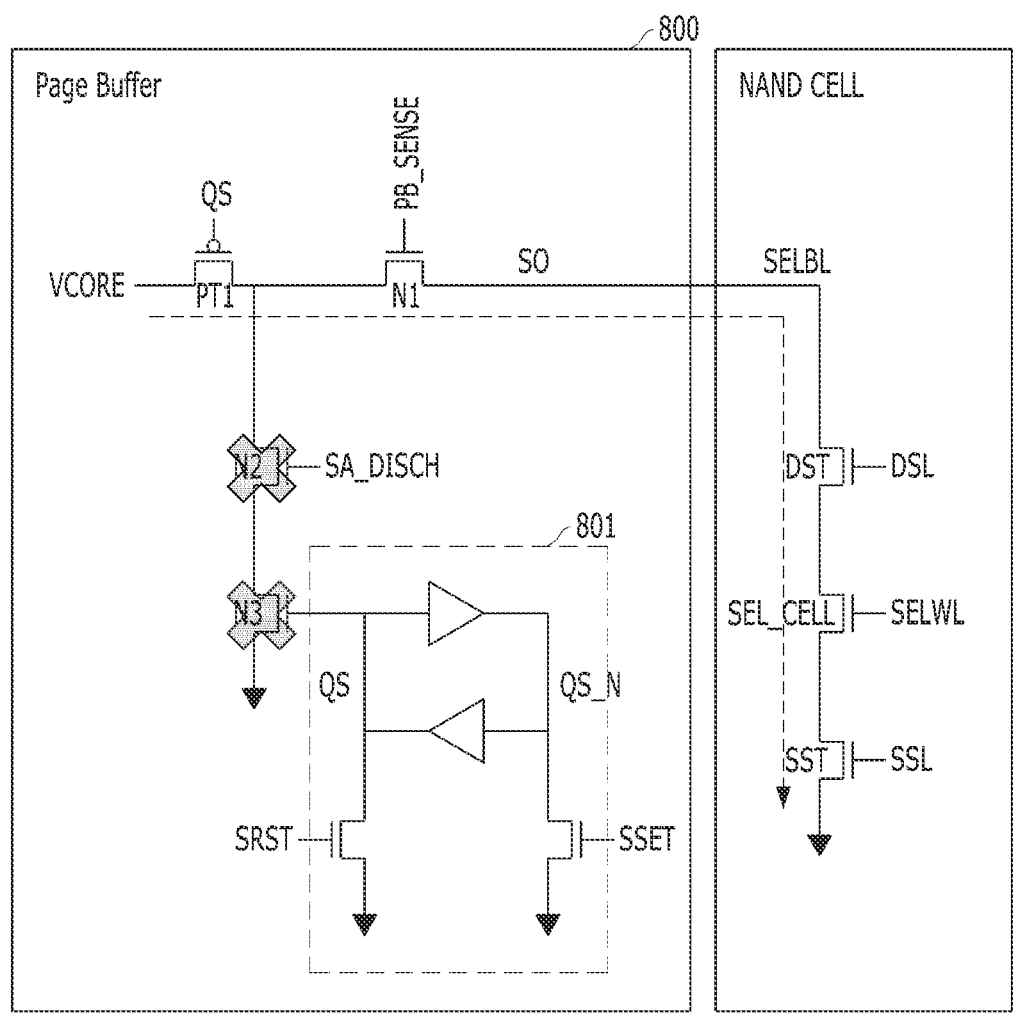
FIG. 8 and FIG. 9 diagrams for describing a method in which a program verify operation in accordance with an embodiment of the present disclosure is applied to a page buffer illustrated in FIG. 2.
Figure 9:
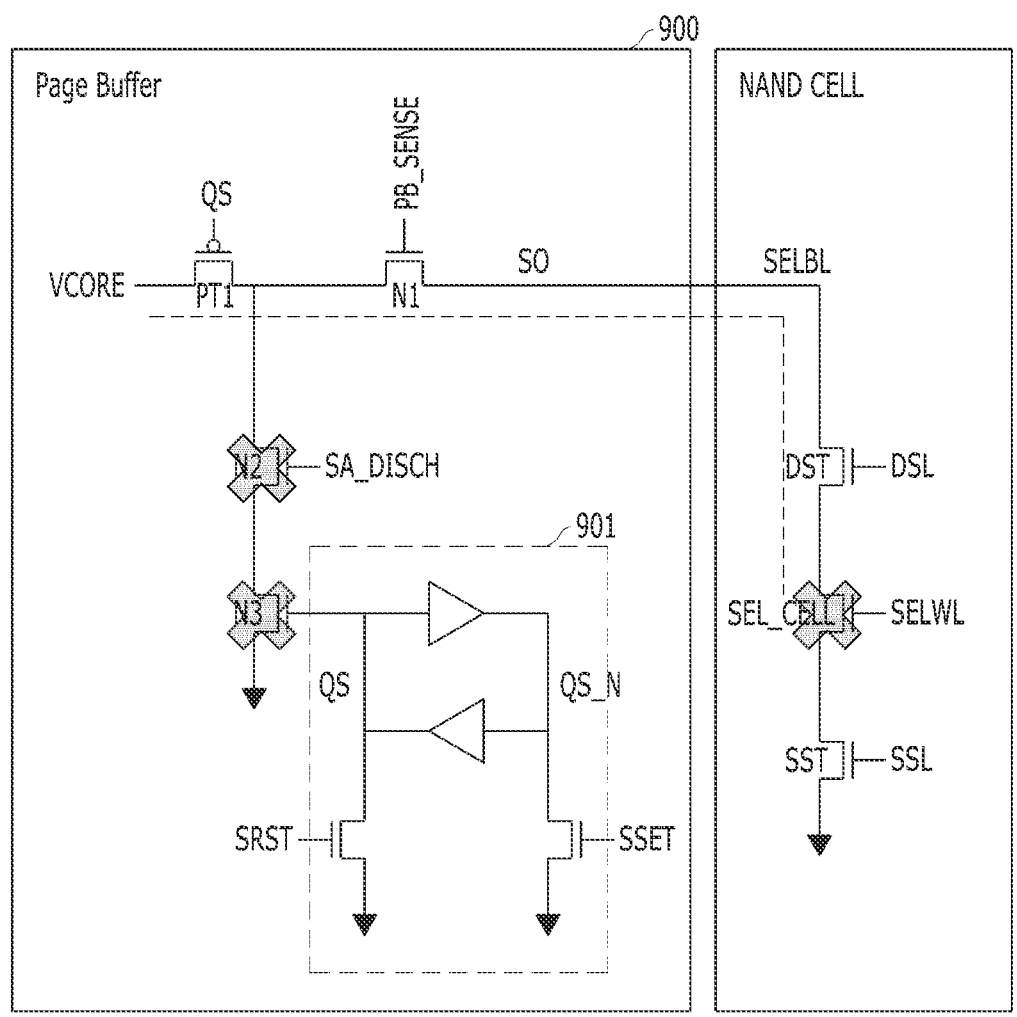

Referring to FIG. 8 and FIG. 9 together with FIG. 1 to FIG. 6, in the present disclosure, the control circuit 152 may start the second verify operation VFP2 in a state in which the first bit line BLG1 is not discharged regardless of the pass or fail of the first verify operation VFP1, and set a value QS stored in latches 801 and 901 included in page buffers 800 and 900 connected to the first bit lines BLG1 to a specific value in order to mask the page buffers 800 and 900 connected to the first bit lines BLG1 in the second verify operation VFP2. For example, in the present disclosure, after a pass or fail of the first verify operation VFP1 is determined, the control circuit 152 may set the value QS stored in the latches 801 and 901 included in the page buffers 800 and 900 connected to the first bit lines BLG1 to a logic 'low', thereby allowing the precharge voltage VCORE to be continuously supplied to sensing nodes SO of the page buffers 800 and 900 without discharging the sensing nodes SO of the page buffers 800 and 900.

After the first verify operation VFP1 is completed, the control circuit 152 may raise the voltage level of the second bit line BLG2 to the precharge voltage level PCLV through the bit line precharge operation at the start time of the second verify operation VFP2.

After the voltage level of the second bit line BLG2 to the precharge voltage level PCLV, the control circuit 152 may continuously maintain the precharge voltage level PCLV of a bit line of the second bit lines BLG2, to which a memory cell having a threshold voltage level higher than the first voltage (PV1) level is connected, during the second verify operation VFP2, thereby determining the result of the second verify operation VFP2 as a pass.

After raising the voltage level of the second bit line BLG2 to the precharge voltage level PCLV, the control circuit 152 may lower the voltage level of a bit line of the second bit lines BLG2, to which a memory cell having a threshold voltage level equal to or lower than the first voltage (PV1) level is connected, to a level lower than the precharge voltage level PCLV during the second verify operation VFP2, thereby determining the result of the second verify operation VFP2 as a fail.

After the pass or fail of the second verify operation VFP2 for the second bit line BLG2 is determined, the control circuit 152 may discharge both the first bit line BLG1 and the second bit line BLG2. Subsequently, the control circuit 152 may switch, to a program inhibit state, each of the bit line of the first bit lines BLG1 determined as pass in the first verify operation VFP1 and the bit line of the second bit lines BLG2 determined as pass in the second verify operation VFP2, and perform a subsequent program operation.

When the voltage level of the second bit line BLG2 is raised to the precharge voltage level PCLV through the bit line precharge operation at the start time of the second verify operation VFP2, the voltage level of the first bit line BLG1 adjacent to the second bit line BLG2 may also be raised due to a coupling effect.

More specifically, a bit line of the first bit lines BLG1, which is determined by the control circuit 152 as a pass in the first verify operation VFP1 and substantially maintains the precharge voltage level PCLV, may have a voltage level floated during the second verify operation VFP2 of performing the verify operation by using the first voltage PV1 because a memory cell SEL_CELL connected to the sensing node SO of the page buffer 900 is in a turned-off state due to its threshold voltage level higher than the second voltage PV2 as illustrated in FIG. 9. In this way, the voltage level of the bit line of the first bit lines BLG1, which is floated to the precharge voltage level PCLV, may be raised to a voltage level PCLV+a higher than the precharge voltage level PCLV at the start time of the second verify operation VFP2 due to a coupling effect with the adjacent second bit line BLG2.

Furthermore, a bit line of the first bit lines BLG1, which is determined as fail in the first verify operation VFP1 and has a voltage level lowered to a voltage level lower than the precharge voltage level PCLV, may have a voltage level floated or may receive a precharge voltage applied thereto during the second verify operation VFP2 of performing the verify operation by using the first voltage PV1 because the threshold voltage level of a memory cell connected to the bit line is lower than the second voltage PV2.

In such a case, a bit line of the first bit lines BLG1, in which the memory cell SEL_CELL connected to the sensing node SO of the page buffer 900 is turned off because its threshold voltage level is higher than the first voltage PV1 as illustrated in FIG. 9, may have a voltage level raised to the precharge voltage level PCLV at the start time of the second verify operation VFP2 and then floated to the precharge voltage level PCLV during the second verify operation VFP2.

Furthermore, a bit line of the first bit lines BLG1, in which the memory cell SEL_CELL connected to the sensing node SO of the page buffer 900 is turned on because its threshold voltage level is lower than the first voltage PV1 as illustrated in FIG. 8, may have a voltage level raised to the precharge voltage level PCLV at the start time of the second verify operation VFP2 and then substantially maintain the precharge voltage level PCLV due to a precharge voltage applied during the second verify operation VFP2.

In summary, in the present disclosure, the control circuit 152 does not discharge the first bit line BLG1 after performing the first verify operation VFP1, and may float the first bit line BLG1 or apply a precharge voltage to the first bit line BLG1 during the second verify operation VFP2 performed after the first verify operation VFP1, which makes it possible to minimize the time required for raising the voltage level of the second bit line BLG2 to the precharge voltage level PCLV at the start time of the second verify operation VFP2.

Furthermore, in the present disclosure, the control circuit 152 may not determine a pass or fail of the second verify operation VFP2 on the first bit line BLG1 by masking a page buffer connected to the first bit line BLG1 during the second verify operation VFP2, which may not affect the result of the second verify operation VFP2 regardless of the voltage level of the first bit line BLG1 in the second verify operation VFP2.

Furthermore, in the present disclosure, the control circuit 152 may use the second voltage PV2 in the previously performed first verify operation VFP1 and use the first voltage PV1 having a level lower than the second voltage PV2 in the second verify operation VFP2 performed after the first verify operation VFP1, which makes it possible to maximize the number of bit lines of the first bit lines BLG1, the bit lines each maintaining a floating state during the second verify operation VFP2.

That is, in the present disclosure, since the control circuit 152 sets the target threshold voltage level of a memory cell connected to the first bit line BLG1 corresponding to the first verify operation VFP1 to be higher than the target threshold voltage level of a memory cell connected to the second bit line BLG2 corresponding to the second verify operation VFP2, most of the first bit lines BLG1 may be each controlled to have a floating state during the second verify operation VFP2, which makes it possible to minimize current consumption.

For reference, illustrated in FIG. 8 and FIG. 9, reference numerals 'SELWL', 'SELBL', and 'SEL_CELL' may mean the selected word line, the selected bit line, and the selected memory cell. Reference numerals 'DSL', 'SSL', 'DST' and 'SST' may mean the drain selection line, the source selection line, the source selection transistor and the drain selection transistor. Reference numerals 'PB_SENSE' and 'SA_DISCH' may be signals generated by the control logic 153 to control the operation of the page buffers 800 and 900. The signal PB_SENSE may be activated to turn on NMOS transistor N1 and the signal SA_DISCH may be deactivated to turn off NMOS transistor N2 during the verify operation. Reference numerals 'SRST' and 'SSET' may be signals generated by the control logic 153 to set the logic levels of nodes QS and QS_N included in the latches 801 and 901 of the page buffer 801 and 901. The signal SRST and the signal SSET may be activated and deactivated to set the value QS stored in the latches 801 and 901 to a logic 'low', thereby turn off NMOS transistor N3 and turn on PMOS transistor PT1 during the verify operation.

Referring to FIG. 1 to FIG. 5 and FIG. 7, the page buffers PB1 to PBm in accordance with an embodiment of the present disclosure may selectively precharge the plurality of bit lines BL1 to BLm according to the 'selective bit line precharge method' in the program verify periods VF1 to VFn.

Particularly, in FIG. 7, the control circuit 152 sets as an aim of the plurality of program operations PL1 to PLn that a memory cell connected to the first bit lines BLG1 among the plurality of bit lines BL1 to BLm is programmed to the third program state PG3, a memory cell connected to the second bit lines BLG2 not overlapping the first bit lines BLG1 is programmed to the second program state PG2, and a memory cell connected to third bit lines BLG3 not overlapping the first bit lines BLG1 and the second bit lines BLG2 is programmed to the first program state PG1 according to the program data.

In FIG. 6 described above, the control circuit 152 sets as an aim of the plurality of program operations PL1 to PLn that a memory cell connected to the first bit lines BLG1 among the plurality of bit lines BL1 to BLm is programmed to the second program state PG2 and a memory cell connected to the second bit lines BLG2 not overlapping the first bit lines BLG1 is programmed to the first program state PG1 according to the program data.

Accordingly, in FIG. 6, the control circuit 152 may separately and sequentially perform the first verify operation VFP1 corresponding to the first bit lines BLG1 and the second verify operation VFP2 corresponding to the second bit lines BLG2 in the specific program verify period VFx included in the specific program operation PLx.

Similarly, in FIG. 7, the control circuit 152 may separately and sequentially perform the first verify operation VFP1 corresponding to the first bit lines BLG1, the second verify operation VFP2 corresponding to the second bit lines BLG2, and a third verify operation VFP3 corresponding to the third bit lines BLG3 in the specific program verify period VFx included in the specific program operation PLx.

In this way, it can be seen that the embodiment disclosed in FIG. 6 and the embodiment disclosed in FIG. 7 are the same as each other except that the numbers of verify operations included in the specific program verify period VFx are different from each other. Therefore, in the following, only the difference between FIG. 6 and FIG. 7 will be described.

Specifically, in FIG. 7, the control circuit 152 may apply the third voltage PV3 to the selected word line in the first verify operation VFP1 corresponding to the first bit lines BLG1. This may be substantially the same as the operation of the control circuit 152 that applies the second voltage PV2 to the selected word line in the first verify operation VFP1 corresponding to the first bit lines BLG1 in FIG. 6.

Furthermore, in FIG. 7, the control circuit 152 may apply the second voltage PV2 to the selected word line in the second verify operation VFP2 corresponding to the second bit lines BLG2 subsequent to the first verify operation VFP1. This may be substantially the same as the operation of the control circuit 152 that applies the first voltage PV1 to the selected word line in the second verify operation VFP2 corresponding to the second bit lines BLG2 subsequent to the first verify operation VFP1 in FIG. 6.

In FIG. 7, the control circuit 152 may apply the first voltage PV1 to the selected word line in the third verify operation VFP3 corresponding to the third bit lines BLG3 subsequent to the second verify operation VFP2. This may be an operation not described in FIG. 6.

Therefore, with reference to FIG. 7, an operation of applying the first voltage PV1 to the selected word line in the third verify operation VFP3 corresponding to the third bit lines BLG3 subsequent to the second verify operation VFP2 will be described as follows.

First, the control circuit 152 may start the third verify operation VFP3 in a state, in which the first bit lines BLG1 and the second bit lines BLG2 are not discharged, regardless of a pass or fail of the first verify operation VFP1 and the second verify operation VFP2. That is, the control circuit 152 may perform the third verify operation VFP3 in the same state as when all the first bit lines BLG1, the second bit lines BLG2, and the third bit lines BLG3 are selected. In such a case, the control circuit 152 may mask page buffers connected to the first bit line BLG1 and the second bit line BLG2 among the plurality of page buffers PB1 to PBm during the third verify operation VFP3. That is, the control circuit 152 may not verify the program states of the memory cells connected to the first bit line BLG1 and the second bit line BLG2 during the third verify operation VFP3.

Referring to FIG. 8 and FIG. 9 together with FIG. 1 to FIG. 5 and FIG. 7, in the present disclosure, the control circuit 152 may start the third verify operation VFP3 in a state, in which the first bit lines BLG1 and the second bit lines BLG2 are not discharged, regardless of pass or fail of the first verify operation VFP1 and the second verify operation VFP2, and set a value QS stored in the latches 801 and 901 included in the page buffers 800 and 900 connected to the first bit lines BLG1 and the second bit lines BLG2 to a specific value in order to mask the page buffers 800 and 900 connected to the first bit lines BLG1 and the second bit lines BLG2 in the third verify operation VFP3. For example, in the present disclosure, after pass or fail of the second verify operation VFP2 is determined, the control circuit 152 may set the value QS stored in the latches 801 and 901 included in the page buffers 800 and 900 connected to the first bit lines BLG1 and the second bit lines BLG2 to a logic 'low', thereby allowing the precharge voltage VCORE to be continuously supplied to the sensing nodes SO of the page buffers 800 and 900 without discharging the sensing nodes SO of the page buffers 800 and 900.

After the second verify operation VFP2 is completed, the control circuit 152 may raise the voltage level of the third bit line BLG3 to the precharge voltage level PCLV through the bit line precharge operation at the start time of the third verify operation VFP3.

After raising the voltage level of the third bit line BLG3 to the precharge voltage level PCLV, the control circuit 152 may continuously maintain the precharge voltage level PCLV of a bit line of the third bit lines BLG3, to which a memory cell having a threshold voltage level higher than the first voltage (PV1) level is connected, during the third verify operation VFP3, thereby determining the result of the third verify operation VFP3 as a pass.

After raising the voltage level of the third bit line BLG3 to the precharge voltage level PCLV, the control circuit 152 may lower the voltage level of a bit line of the third bit lines BLG3, to which a memory cell having a threshold voltage level equal to or lower than the first voltage (PV1) level is connected, to a level lower than the precharge voltage level PCLV during the third verify operation VFP3, thereby determining the result of the third verify operation VFP3 as a fail.

After the pass or fail of the third verify operation VFP3 for the third bit line BLG3 is determined, the control circuit 152 may discharge all of the first bit line BLG1, the second bit line BLG2, and the third bit line BLG3. Subsequently, the control circuit 152 may switch, to a program inhibit state, each of the bit line of the first bit lines BLG1 determined as a pass in the first verify operation VFP1, the bit line of the second bit line BLG2 determined as a pass in the second verify operation VFP2, and the bit line of the third bit line BLG3 determined as a pass in the third verify operation VFP3, and perform a subsequent program operation.

When the voltage level of the third bit line BLG3 is raised to the precharge voltage level PCLV through the bit line precharge operation at the start time of the third verify operation VFP3, the voltage levels of the first bit line BLG1 and the second bit line BLG2 adjacent to the third bit line BLG3 may also be raised due to a coupling effect.

More specifically, the bit line of the first bit lines BLG1, which is raised to the voltage level PCLV+a higher than the precharge voltage level PCLV in the second verify operation VFP2, may have a voltage level floated during the third verify operation VFP3 of performing the verify operation by using the first voltage PV1 because a memory cell SEL_CELL connected to the sensing node SO of the page buffer 900 is in a turned-off state due to its threshold voltage level being higher than the third voltage PV3 as illustrated in FIG. 9. In this way, the voltage level of the bit line of the first bit lines BLG1, which is floated to the voltage level PCLV+a higher than the precharge voltage level PCLV, may be raised to a voltage level PCLV+a+b higher than the precharge voltage level PCLV at the start time of the third verify operation VFP3 due to a coupling effect with the adjacent third bit line BLG3.

Furthermore, a bit line of the first bit lines BLG1, which substantially maintains the precharge voltage level PCLV in the second verify operation VFP2, may have a voltage level floated or may receive a precharge voltage applied thereto during the third verify operation VFP3 of performing the verify operation by using the first voltage PV1. Of course, since the voltage level of the first bit line BLG1 has been raised to the precharge voltage level PCLV during the second verify operation VFP2, the voltage level of the first bit line BLG1 may be raised to the voltage level PCLV+a higher than the precharge voltage level PCLV at the start time of the third verify operation VFP3 due to the coupling effect with the adjacent third bit line BLG3, regardless of being floated or application of a precharge voltage during the third verify operation VFP3.

In such a case, a bit line of the first bit lines BLG1, in which the memory cell SEL_CELL connected to the sensing node SO of the page buffer 900 is turned off because its threshold voltage level is higher than the first voltage PV1 as illustrated in FIG. 9, may have a voltage level floated to the voltage level PCLV+a higher than the precharge voltage level PCLV during the third verify operation VFP3.

Furthermore, a bit line of the first bit lines BLG1, in which the memory cell SEL_CELL connected to the sensing node SO of the page buffer 900 is turned on because its threshold voltage level is lower than the first voltage PV1 as illustrated in FIG. 8, may have a voltage level raised to the voltage level PCLV+a higher than the precharge voltage level PCLV at the start time of the third verify operation VFP3, and then lowered from the voltage level PCLV+a higher than the precharge voltage level PCLV to the precharge voltage level PCLV due to a precharge voltage applied during the third verify operation VFP3.

Furthermore, since a bit line of the second bit lines BLG2, which is determined as a pass in the second verify operation VFP2 and substantially maintains the precharge voltage level PCLV, may have a voltage level floated during the third verify operation VFP3 of performing the verify operation by using the first voltage PV1 because the threshold voltage level of the memory cell SEL_CELL connected to the sensing node SO of the page buffer 900 is in a turned-off state due to its threshold voltage level being higher than the second voltage PV2 as illustrated in FIG. 9. In this way, the voltage level of the bit line of the second bit lines BLG2, which is floated to the precharge voltage level PCLV, may be raised to the voltage level PCLV+a higher than the precharge voltage level PCLV at the start time of the third verify operation VFP3 due to the coupling effect with the adjacent third bit line BLG3.

Furthermore, a bit line of the second bit lines BLG2, which is determined as a fail in the second verify operation VFP2 and has a voltage level lowered below the precharge voltage level PCLV, may have a voltage level floated or may receive a precharge voltage applied thereto during the third verify operation VFP3 of performing the verify operation by using the first voltage PV1 because the threshold voltage level of a memory cell connected to the bit line is lower than the second voltage PV2.

In such a case, a bit line of the second bit lines BLG2, in which the memory cell SEL_CELL connected to the sensing node SO of the page buffer 900 is turned off because its threshold voltage level is higher than the first voltage PV1 as illustrated in FIG. 9, may have a voltage level raised to the precharge voltage level PCLV at the start time of the third verify operation VFP3, and then floated to the precharge voltage level PCLV during the third verify operation VFP3.

Furthermore, a bit line of the second bit lines BLG2, in which the memory cell SEL_CELL connected to the sensing node SO of the page buffer 900 is turned on because its threshold voltage level is lower than the first voltage PV1 as illustrated in FIG. 8, may have a voltage level raised to the precharge voltage level PCLV at the start time of the third verify operation VFP3, and then substantially maintain the precharge voltage level PCLV due to a precharge voltage applied during the third verify operation VFP3.

In summary, in the present disclosure, the control circuit 152 may not discharge the first bit line BLG1 after performing the first verify operation VFP1, and may float the first bit line BLG1 or apply a precharge voltage to the first bit line BLG1 during the second verify operation VFP2 performed after the first verify operation VFP1, which makes it possible to minimize the time required for raising the voltage level of the second bit line BLG2 to the precharge voltage level PCLV at the start time of the second verify operation VFP2.

Furthermore, in the present disclosure, the control circuit 152 may not discharge the first and second bit lines BLG1 and BLG2 after performing the second verify operation VFP2, and may float the first and second bit lines BLG1 and BLG2 or apply a precharge voltage to the first and second bit lines BLG1 and BLG2 during the third verify operation VFP3 performed after the second verify operation VFP2, which makes it possible to minimize the time required for raising the voltage level of the third bit line BLG3 to the precharge voltage level PCLV at the start time of the third verify operation VFP3.

Furthermore, in the present disclosure, the control circuit 152 may not determine a pass or fail of the second verify operation VFP2 on the first bit line BLG1 by masking a page buffer connected to the first bit line BLG1 during the second verify operation VFP2, which may not affect the result of the second verify operation VFP2 regardless of the voltage level of the first bit line BLG1 in the second verify operation VFP2.

Furthermore, in the present disclosure, the control circuit 152 may not determine a pass or fall of the second verify operation VFP2 on the first and second bit lines BLG1 and BLG2 by masking page buffers connected to the first and second bit lines BLG1 and BLG2 during the third verify operation VFP3, which may not affect the result of the third verify operation VFP3 regardless of the voltage levels of the first and second bit lines BLG1 and BLG2 in the third verify operation VFP3.

Furthermore, in the present disclosure, the control circuit 152 may use the third voltage PV3 in the previously performed first verify operation VFP1, may use the second voltage PV2 having a lower level than the third voltage PV3 in the second verify operation VFP2 performed after the first verify operation VFP1, and may use the first voltage PV1 having a lower level than the second voltage PV2 in the third verify operation VFP3 performed after the second verify operation VFP2, which makes it possible to maximize the number of bit lines of the first bit lines BLG1, the bit lines each maintaining a floating state in the execution periods of the second and third verify operations VFP2 and VFP3 and to maximize the number of bit lines of the second bit lines BLG2, the bit lines each maintaining a floating state during the third verify operation VFP3.

That is, in the present disclosure, since the control circuit 152 sets the target threshold voltage level of a memory cell connected to the first bit line BLG1 corresponding to the first verify operation VFP1 to be higher than the target threshold voltage level of a memory cell connected to the second bit line BLG2 corresponding to the second verify operation VFP2, and sets the target threshold voltage level of a memory cell connected to the second bit line BLG2 corresponding to the second verify operation VFP2 to be higher than the target threshold voltage level of a memory cell connected to the third bit line BLG3 corresponding to the third verify operation VFP3, most of the first bit lines BLG1 may each be controlled to have a floating state during the second verify operation VFP2 and most of the first and second bit lines BLG1 and BLG2 may each be controlled to have a floating state during the third verify operation VFP3, which makes it possible to minimize current consumption.

The above-described embodiment of the present disclosure has described that the characteristic operations of the present disclosure are applied when verifying the program state of memory cells connected to the plurality of bit lines BL1 to BLm in each of the program verify periods VF1 to VFn.

However, the characteristic operations of the present disclosure may also be applied even when reading values stored in the memory cells connected to the plurality of bit lines BL1 to BLm in a read operation.

However, in the read operation, after the plurality of bit lines BL1 to BLm are divided into at least two groups through the 'entire bit line precharge method' in which all of the plurality of bit lines BL1 to BLm are precharged, it is necessary to use a method of selecting and precharging each of at least two groups.

For example, in the read operation, a specific voltage may be applied to a selected word line for the read operation in a state in which all of the plurality of bit lines BL1 to BLm are precharged, and the threshold voltage level of a memory cell connected between the selected word line and the bit lines BL1 to BLm may be compared with the level of the specific voltage. As a result of the comparison, among the bit lines BL1 to BLm, a bit line connected to a memory cell having a threshold voltage level higher than the level of the specific voltage may be selected as the first bit line, and a bit line connected to a memory cell having a threshold voltage level lower than the level of the specific voltage may be selected as the second bit line. Subsequently, a first read operation may be performed to read a value of data stored in a memory cell connected between the selected word line and the first bit line by applying a precharge voltage to the first bit line and applying a first read voltage having a higher level than the specific voltage to the selected word line. Subsequently, a second read operation may be performed to read a value of data stored in a memory cell connected between the selected word line and the second bit line by applying the precharge voltage to the second bit line and applying a second read voltage having a lower level than the specific voltage to the selected word line. In such a case, after the first read operation is performed, the first bit line may not be discharged, and the first bit line may have a voltage level floated or receive the precharge voltage applied thereto during the subsequent second read operation. As described above, it can be seen that the characteristic operations of the present disclosure may be applied to the read operation.

The present disclosure described above is not limited to the aforementioned embodiments and the accompanying drawings, and it will be apparent to those skilled in the art to which the present disclosure pertains that various replacements, modifications, and changes can be made without departing from the technical spirit of the present disclosure and the following claims.

For example, the position and the type of a logic gate and a transistor illustrated in the aforementioned embodiments should be differentially implemented according to the polarity of an inputted signal. Furthermore, the embodiments may be combined to form additional embodiments.

What is claimed is:

1. A memory device comprising:
a plurality of page buffers connected to a plurality of memory cells through a plurality of bit lines and configured to selectively precharge the bit lines; and
a control circuit configured to:
perform a first verify operation by applying a precharge voltage to at least one first bit line among the bit lines according to program data and by applying a first verify voltage to a selected word line,
perform a second verify operation, after the first verify operation, by applying the precharge voltage to at least one second bit line not overlapping the first bit line and by applying a second verify voltage to the selected word line,
perform an operation of floating the first bit line connected to the memory cell programmed with a threshold voltage higher than the second verify voltage, and
perform the operation of applying the precharge voltage to the first bit line connected to the memory cell programmed with the threshold voltage lower than the second verify voltage.

2. The memory device of claim 1,
wherein the control circuit is further configured to sequentially apply a plurality of program voltages to the selected word line until a program is completed,
wherein the control circuit is configured to sequentially perform the first and second verify operations in a program verify period between applying a consecutive first program voltage and second program voltage among the plurality of program voltages, and
wherein the control circuit is further configured to perform an operation of discharging the first and second bit lines.

3. The memory device of claim 1, wherein the control circuit is further configured to mask a page buffer connected to the first bit line among the page buffers during the second verify operation.

4. The memory device of claim 1, wherein the first verify voltage is higher than the second verify voltage.

5. An operation method of a memory device, the operation method comprising:

sequentially applying a plurality of program voltages to a selected word line until a program is completed;
performing a first verify operation by applying a precharge voltage to at least one selected first bit line according to program data and by applying a first verify voltage to the selected word line in a program verify period between applying a consecutive first program voltage and a second program voltage among the plurality of program voltages;
performing a second verify operation, after the first verify operation in the program verify period, by applying the precharge voltage to at least one second bit line not overlapping the first bit line and selected according to the program data and by applying a second verify voltage to the selected word line;
performing an operation of floating the first bit line connected to the memory cell programmed with a target threshold voltage higher than the second verify voltage; and
performing the operation of applying the precharge voltage to the first bit line connected to the memory cell programmed with the target threshold voltage lower than the second verify voltage.

6. The operation method of claim 5, further comprising performing, after the second verify operation, an operation of discharging the first and second bit lines and terminating the program verify period.

7. The operation method of claim 5, further comprising masking a page buffer connected to the first bit line during the second verify operation.

8. The operation method of claim 5, wherein the first verify voltage is higher than the second verify voltage.

9. A memory device comprising:
a plurality of page buffers connected to a plurality of memory cells through a plurality of bit lines and configured to selectively precharge the bit lines; and
a control circuit configured to perform a first operation by applying a precharge voltage to at least one first bit line among the bit lines and applying a first voltage to a selected word line, to perform a second operation, after the first operation, by applying the precharge voltage to at least one second bit line not overlapping the first bit line and applying a second voltage to the selected word line, to perform an operation of floating the first bit line connected to a memory cell programmed with a threshold voltage higher than the second voltage during the second operation, and to perform an operation of applying the precharge voltage to the first bit line connected to a memory cell programmed with a threshold voltage lower than the second voltage during the second operation.

10. The memory device of claim 9, wherein, during a program operation, the control circuit sequentially applies a plurality of program voltages to the selected word line until a program is completed, sequentially performs the first and second operations by sequentially selecting the first and second bit lines from the plurality of bit lines according to program data in a program verify period between a consecutive first program voltage and second program voltage among the plurality of program voltages, and performs an operation of discharging the first and second bit lines.

11. The memory device of claim 9, wherein the control circuit sets a level of the first voltage to a level higher than a level of the second voltage.

12. The memory device of claim 11, wherein the control circuit is further configured to perform, during a read operation, a third operation by applying a third voltage having a level lower than the first voltage and higher than the second voltage to the selected word line and by applying the precharge voltage to all the bit lines, sequentially perform the first and second operations by selecting each of the first and second bit lines from the plurality of bit lines according to a result of performing the third operation, and perform an operation of discharging the first and second bit lines.

13. The memory device of claim 9, wherein the control circuit masks a page buffer connected to the first bit line among the page buffers during the second operation.

* * * * *